United States Patent
Hanaoka (10) Patent No.: US 10,580,622 B2
(45) Date of Patent: Mar. 3, 2020

(54) PLASMA PROCESSING APPARATUS

(71) Applicant: Tokyo Electron Limited, Tokyo (JP)

(72) Inventor: Hidetoshi Hanaoka, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/942,622

(22) Filed: Apr. 2, 2018

(65) Prior Publication Data

US 2018/0294147 A1 Oct. 11, 2018

Related U.S. Application Data

(62) Division of application No. 14/382,898, filed as application No. PCT/JP2013/060304 on Apr. 4, 2013, now Pat. No. 9,966,233.
(Continued)

(30) Foreign Application Priority Data

Apr. 5, 2012 (JP) .................. 2012-086180

(51) Int. Cl.
*C23C 16/00* (2006.01)
*H01L 21/00* (2006.01)
(Continued)

(52) U.S. Cl.
CPC .. *H01J 37/32559* (2013.01); *H01J 37/32027* (2013.01); *H01J 37/32091* (2013.01);
(Continued)

(58) Field of Classification Search
CPC .......... H01J 37/32559; H01J 37/32027; H01J 37/32651
See application file for complete search history.

(56) References Cited

U.S. PATENT DOCUMENTS 7,601,241 B2 10/2009 Tetsuka
2007/0224817 A1 9/2007 Honda
(Continued)

FOREIGN PATENT DOCUMENTS

JP 2001-509645 A 7/2001
JP 2005-302848 A 10/2005
(Continued)

OTHER PUBLICATIONS

International Search Report for International Application No. PCT/JP2013/060304 dated Jun. 25, 2013.

*Primary Examiner* — Sylvia MacArthur
*Assistant Examiner* — Michelle Crowell
(74) *Attorney, Agent, or Firm* — Pearne & Gordon LLP (57) ABSTRACT

A plasma processing apparatus of exciting a processing gas into plasma by applying a high frequency power between an upper electrode and a lower electrode provided within a processing chamber and performing a plasma process on a target object to be processed with the plasma includes a DC power supply configured to apply a DC voltage to the upper electrode; a ground electrode connected to the DC power supply; and an annular shield member provided outside the ground electrode. A groove is formed into a downward recess at an outer peripheral portion of the ground electrode, and an upper end of the shield member is positioned above an upper end of the peripheral portion of the ground electrode. A protruding portion, which is protruded toward a center of the ground electrode, is formed at a portion of the shield member positioned above the ground electrode.

3 Claims, 8 Drawing Sheets

Related U.S. Application Data

(60) Provisional application No. 61/623,685, filed on Apr. 13, 2012.

(51) Int. Cl.
  *H01J 37/32* (2006.01)
  *H01L 21/311* (2006.01)

(52) U.S. Cl.
  CPC .. *H01J 37/32532* (2013.01); *H01J 37/32651* (2013.01); *H01J 37/32697* (2013.01); *H01L 21/31116* (2013.01)

(56) References Cited

U.S. PATENT DOCUMENTS

| | | | |
|---|---|---|---|
| 2007/0234960 A1* | 10/2007 | Honda | C23C 16/4401 118/723 E |
| 2008/0236752 A1 | 10/2008 | Honda | |
| 2009/0101283 A1 | 4/2009 | Iwata | |
| 2012/0160418 A1* | 6/2012 | Hanaoka | H01J 37/32082 156/345.38 |

FOREIGN PATENT DOCUMENTS

| JP | 2008-251744 A | 10/2018 |
|---|---|---|
| WO | 99/03131 A1 | 1/1999 |

* cited by examiner

PLASMA PROCESSING APPARATUS

CROSS-REFERENCE TO RELATED APPLICATION

This is a divisional application of U.S. patent application Ser. No. 14/382,898, filed on Sep. 4, 2014, which is U.S. national phase application under 35 U.S.C. § 371 of PCT Application No. PCT/JP2013/060304 filed on Apr. 4, 2013 and claims the benefit of Japanese Patent Application No. 2012-086180 filed on Apr. 5, 2012, and U.S. Provisional Application Ser. No. 61/623,685 filed on Apr. 13, 2012, the disclosures of which are incorporated herein by reference.

TECHNICAL FIELD

The embodiments described herein pertain generally to a plasma processing apparatus of performing a plasma process on a target object to be processed.

BACKGROUND

A parallel-plate type (capacitively coupled) plasma processing apparatus, an inductively coupled plasma processing apparatus, a microwave plasma processing apparatus, and the like have been used as an apparatus for performing microprocessing, such as etching or film formation, onto a target object to be processed, e.g., a semiconductor wafer (hereinafter, referred to as "wafer") by plasma.

In the parallel-plate type plasma processing apparatus among these apparatuses, a high frequency power is applied to at least any one of an upper electrode and a lower electrode provided to face each other within a processing chamber and a gas is excited into plasma by electric field energy of the high frequency power. Then, the target object is microprocessed through a plasma process, e.g., an etching process, by the generated electric discharge plasma.

In recent years, for the purpose of improving performance of a plasma process in such a parallel-plate type plasma processing apparatus, there has been suggested a process of applying a DC voltage into a processing chamber by connecting an upper electrode to a DC power supply. In such a plasma processing apparatus, in order to apply a DC voltage to the upper electrode, a surface of a grounded electrode (hereinafter, referred to as "ground electrode") paired with the upper electrode is exposed within a processing chamber.

However, in some cases, a reaction product generated from a plasma process may be deposited on the exposed surface of the ground electrode, so that a DC current flow between the upper electrode and the ground electrode may be impeded. As a result, it is difficult to appropriately apply a DC voltage into the processing chamber, so that plasma becomes unstable.

Therefore, in order to solve such a problem, for example, Patent Document 1 suggests providing a shield wall around the ground electrode to suppress adhesion of the reaction product caused by the plasma to the ground electrode.

REFERENCES

Patent Document 1: Japanese Patent Laid-open Publication No. 2008-251744

DISCLOSURE OF THE INVENTION

Problems to be Solved by the Invention

However, when a reaction product generated from a plasma process has high adhesive force, or a plasma process is performed for a long time, even if the above-described solution is taken, it is difficult to avoid adhesion of the reaction product to a ground electrode, and function of the ground electrode is deteriorated with the lapse of time.

In view of the foregoing, example embodiments are provided to suppress adhesion of a reaction product generated from a plasma process to a ground electrode provided within a processing chamber and to stably apply a DC voltage into the processing chamber for a long time.

Means for Solving the Problems

In one example embodiment, a plasma processing apparatus of exciting a processing gas into plasma by applying a high frequency power between an upper electrode and a lower electrode provided within a processing chamber and performing a plasma process on a target object to be processed with the plasma includes a DC power supply configured to apply a DC voltage to the upper electrode; a ground electrode, provided within the processing chamber, configured to serve as a ground with respect to the DC voltage applied to the upper electrode; and an annular shield member provided outside the ground electrode. Further, a groove is formed into a downward recess with a first peripheral portion at an outer peripheral portion of the ground electrode, and an upper end of the shield member is positioned above an upper end of the first peripheral portion of the ground electrode. Further, a protruding portion, which is protruded toward a center of the ground electrode, is formed at a portion of the shield member positioned above the ground electrode.

In accordance with the example embodiments, the shield member having the protruding portion suppresses adhesion of a reaction product generated from the plasma process to the ground electrode. Further, since the groove is formed at the ground electrode, an exposed portion of the ground electrode within the processing chamber has a relatively large surface area as compare with the conventional ground electrode, so that a function deterioration of the ground electrode when the reaction product adheres to the ground electrode can be decreased as compared with the conventional case. As a result, it is possible to stably apply a DC voltage into the processing chamber for a long time.

Effect of the Invention

In accordance with the example embodiments, it is possible to suppress adhesion of a reaction product generated from a plasma process to a ground electrode provided within a processing chamber and also possible to stably apply a DC voltage into the processing chamber for a long time.

MODE FOR CARRYING OUT THE INVENTION

Figure 1:
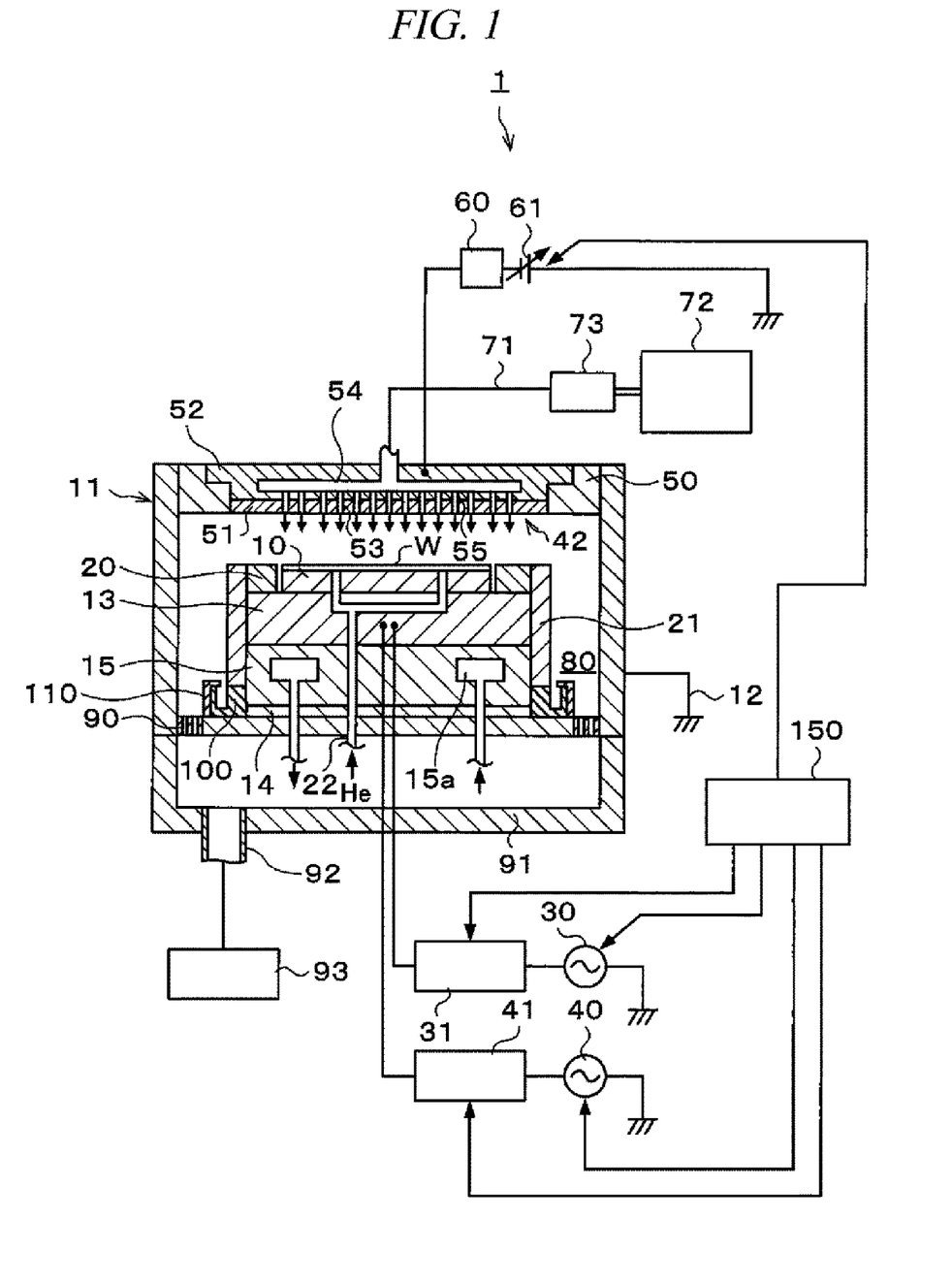
FIG. 1 is a longitudinal cross-sectional view schematically showing a configuration of a plasma processing apparatus in accordance with an example embodiment.

Hereinafter, an example embodiment will be explained with reference to the accompanying drawings. FIG. 1 is a longitudinal cross-sectional view schematically showing a configuration of a plasma processing apparatus 1 in accordance with an example embodiment. The plasma processing apparatus 1 in accordance with the present example embodiment is, for example, a parallel-plate type plasma etching apparatus.

The plasma processing apparatus 1 includes a substantially cylindrical processing chamber 11 in which a wafer chuck 10 configured to hold thereon a wafer W as a silicon substrate is provided. The processing chamber 11 is electrically grounded via a grounding line 12. Further, an inner wall of the processing chamber 11 is covered with a liner (not illustrated) on which a thermally sprayed film of a plasma resistant material is formed.

A lower surface of the wafer chuck 10 is supported on a susceptor 13 serving as a lower electrode. The susceptor 13 is formed of metal such as aluminum and has a substantially disc shape. At a bottom portion of the processing chamber 11, a supporting table 15 is provided via an insulating plate 14, and the susceptor 13 is supported on a top surface of the supporting table 15. Within the wafer chuck 10, an electrode (not illustrated) is provided. The wafer chuck 10 is configured to attract and hold the wafer W with electrostatic force generated by applying a DC voltage to the electrode.

At an outer periphery of the wafer chuck 10 on a top surface of the susceptor 13, there is provided a conductive correction ring 20 made of, e.g., silicon in order to improve uniformity in the plasma process. The outer side surfaces of the susceptor 13, the supporting table 15, and the correction ring 20 are covered with a cylindrical member 21 made of, e.g., quartz.

Within the supporting table 15, a coolant path 15a through which a coolant flows is formed into, for example, a circular ring shape. By controlling a temperature of the coolant to be supplied into the coolant path 15a, a temperature of the wafer W held on the wafer chuck 10 can be controlled. Further, a heat transfer gas line 22 configured to supply a heat transfer gas, for example, a helium gas between the wafer chuck 10 and the wafer W held on the wafer chuck 10 is formed to penetrate, for example, the wafer chuck 10, the susceptor 13, the supporting table 15, and the insulating plate 14.

The susceptor 13 is electrically connected with a first high frequency power supply 30 configured to supply a high frequency power for plasma generation to the susceptor 13 via a first matching unit 31. The first high frequency power supply 30 is configured to output the high frequency power having a frequency of, for example, from about 27 MHz to about 100 MHz, e.g., about 40 MHz in the present example embodiment. The first matching unit 31 is configured to match an inner impedance of the first high frequency power supply 30 with a load impedance, and is operated to apparently match the inner impedance of the first high frequency power supply 30 with the load impedance when plasma is generated within the processing chamber 11.

Further, the susceptor 13 is electrically connected with a second high frequency power supply 40 configured to supply a high frequency power for ion attraction to the susceptor 13 and apply a bias to the wafer W via a second matching unit 41. The second high frequency power supply 40 is configured to output the high frequency power having a frequency of, for example, from about 400 kHz to about 13.56 MHz, e.g., about 3.2 MHz in the present example embodiment. The second matching unit 41 is configured to match an inner impedance of the second high frequency power supply 40 with a load impedance in the same manner as the first matching unit 31.

Above the susceptor 13 serving as the lower electrode, an upper electrode 42 is provided in parallel to face the susceptor 13. The upper electrode 42 is supported at an upper portion of the processing chamber 11 via an insulating shield member 50. Thus, the upper electrode 42 is electrically insulated from the processing chamber 11 which has a ground potential.

The upper electrode 42 includes an electrode plate 51 that has a surface facing the wafer W held on the wafer chuck 10; and an electrode supporting plate 52 configured to support the electrode plate 51 from above. In the electrode plate 51, multiple gas supply openings 53 through which a processing gas is supplied into the processing chamber 11 are formed through the electrode plate 51. The electrode plate 51 is made of, for example, a semiconductor or a low-resistance conductor having a low Joule's heat, and made of, for example, silicon in the present example embodiment. Further, the electrode supporting plate 52 is made of a conductor, for example, aluminum in the present example embodiment.

Further, the upper electrode 42 is electrically connected with a DC power supply 61 via a low pass filter 60 configured to trap the high frequency power from the first high frequency power supply 30 and the high frequency power from the second high frequency power supply 40. The DC power supply 61 is configured to apply a negative DC voltage to the upper electrode 42. In the present example embodiment, the negative DC voltage is in a range of from about 150 V to about 1200 V.

The first high frequency power supply 30, the first matching unit 31, the second high frequency power supply 40, the second matching unit 41, and the DC power supply 61 are connected to a control unit 150 to be described below, and operations thereof are controlled by the control unit 150.

At a central portion within the electrode supporting plate 52, there is provided a gas diffusion room 54 of substantially cylindrical shape. Further, at a lower portion of the electrode supporting plate 52, there are formed multiple gas holes 55 downwardly extending from the gas diffusion room 54. The gas supply openings 53 are communicated with the gas diffusion room 54 via the gas holes 55.

The gas diffusion room 54 is connected with a gas supply line 71. The gas supply line 71 is connected with a processing gas supply source 72 as depicted in FIG. 1. A processing gas supplied from the processing gas supply source 72 is supplied to the gas diffusion room 54 via the gas supply line 71. The processing gas supplied into the gas diffusion room 54 is introduced into the processing chamber 11 through the gas holes 55 and the gas supply openings 53. That is, the upper electrode 42 serves as a shower head that supplies the processing gas into the processing chamber 11. Further, various gases conventionally used for the plasma etching may be used as the processing gas.

The gas supply line 71 is provided with a flow rate control unit 73 configured to control an amount of a gas to be supplied from the processing gas supply source 72 to the gas diffusion room 54. The flow rate control unit 73 includes, for example, a mass flow controller and a valve.

At a bottom portion of the processing chamber 11, an exhaust path 80 serving as a path through which an atmosphere within the processing chamber 11 is exhausted to an outside of the processing chamber 11 is formed between an inner wall of the processing chamber 11 and an outer surface of the cylindrical member 21. At a bottom surface of the processing chamber 11, an exhaust opening 90 is formed. Under the exhaust opening 90, an exhaust chamber 91 is formed. The exhaust chamber 91 is connected with an exhaust device 93 via an exhaust pipe 92. Thus, by operating the exhaust device 93, the atmosphere within the processing chamber 11 can be exhausted through the exhaust path 80 and the exhaust opening 90, and an inside of the processing chamber 11 can be depressurized to a certain vacuum level.

At a lower side of the exhaust path 80 outside the supporting table 15, an annular ground electrode 100, which is grounded, is provided. The ground electrode 100 is formed of a conductive material, for example, silicon or the like. This ground electrode 100 is a positive electrode (ground) paired with the upper electrode 42 serving as a negative electrode to which the negative DC voltage is applied. Further, the ground electrode 100 serves as a ground with respect to the DC voltage applied to the upper electrode 42.

Outside the ground electrode 100, there is provided a shield member 110 configured to shield the ground electrode 100 from the exhaust path 80 and suppress a reaction product caused by the plasma from adhering to the ground electrode 100. The shield member 110 is annularly formed of an insulating material, for example, quartz, and concentrically arranged with the ground electrode 100.

Figure 2:
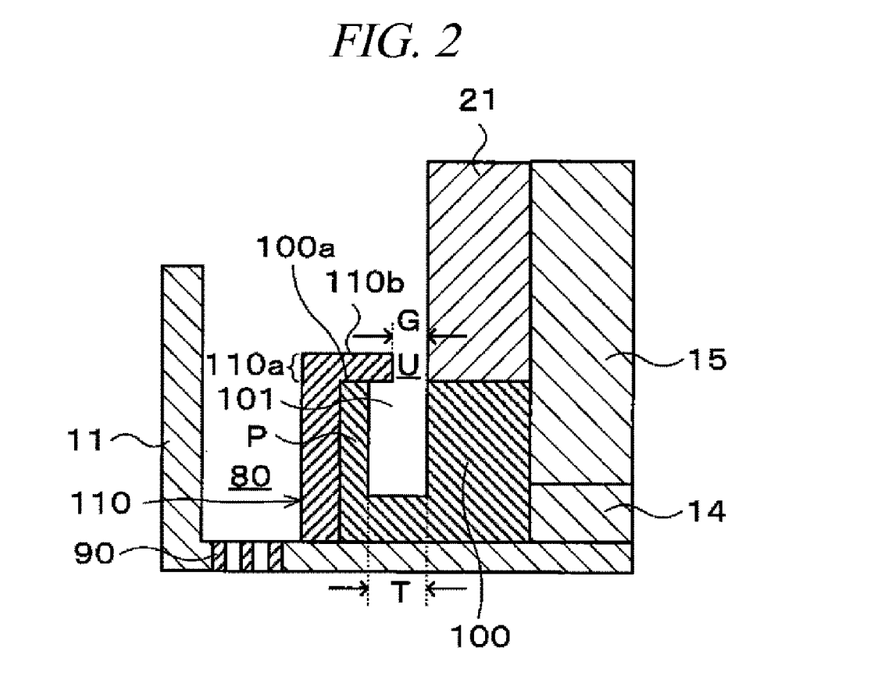
FIG. 2 is a longitudinal cross-sectional view schematically showing a configuration around a ground electrode and a shield member.
Figure 3:
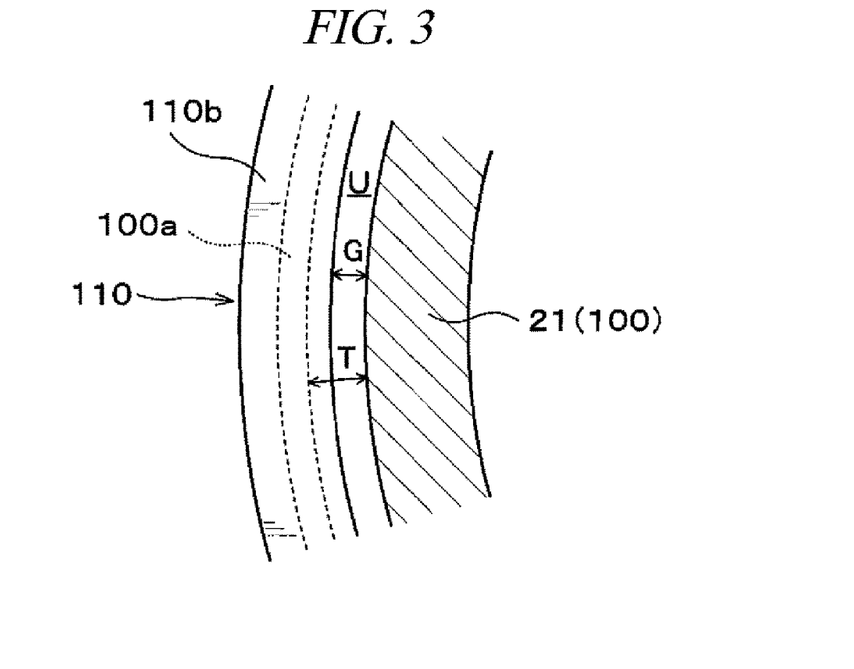
FIG. 3 is a transversal cross-sectional view schematically showing a configuration around the ground electrode and the shield member.

Hereinafter, the ground electrode 100 and the shield member 110 will be explained in detail. As shown in FIG. 2 and FIG. 3, the annular ground electrode 100 is arranged on a top surface of the bottom portion of the processing chamber 11 at a lower side of the cylindrical member 21 to cover a part of a side surface of the supporting table 15. At a portion in contact with the ground electrode 100 on the top surface of the bottom portion of the processing chamber 11, a liner of a thermally sprayed film is not formed, so that the ground electrode 100 is electrically connected with the bottom surface of the processing chamber 11. Thus, the ground electrode 100 is grounded by the grounding line 12 via the processing chamber 11. Further, a surface of the ground electrode 100 opposite to the supporting table 15 is exposed to the exhaust path 80. For this reason, electrons emitted from the electrode plate 51 of the upper electrode 42 when a DC voltage is applied may reach the ground electrode 100.

An outer peripheral portion of the ground electrode 100 is protruded outwards further than the outer surface of the cylindrical member 21. On a top surface of the outer peripheral portion of the ground electrode 100, more specifically, a top surface of a portion protruding outwards further than the outer surface of the cylindrical member 21, a groove 101 having a certain width T is formed into a downward recess with a peripheral portion (first peripheral portion) P. Therefore, when the ground electrode 100 is cut along a diametrical direction, a longitudinal cross section thereof has, for example, a substantially U-shape as shown in FIG. 2.

An inner surface of the shield member 110 is in contact with an outer surface of the peripheral portion P of the ground electrode 100. Further, a lower end of the shield member 110 is provided to be in contact with the bottom surface of the processing chamber 11. Thus, an outer peripheral surface of the ground electrode 100 is covered by the shield member 110 to be shielded from the exhaust path 80.

An upper end portion 110a of the shield member 110 is formed to have a position higher than an upper end surface 100a of the peripheral portion P of the ground electrode 100. Further, at the upper end portion 110a, there is formed a protruding portion 110b, which is protruded toward a center of the ground electrode 100 (the right side in FIG. 2). Thus, a longitudinal cross section of the shield member 110 has, for example, an inverse L-shape as shown in FIG. 2.

A lower surface of the protruding portion 110b is in contact with an outer region of the groove 101 of the ground electrode 100, i.e., the upper end surface 100a of the peripheral portion P. In a plane view, the protruding portion 110b is formed into, for example, an eaves shape such that a front end of the protruding portion 110b covers the peripheral portion P and is positioned above the groove 101 of the ground electrode 100. In other words, a width G of a gap U formed between the front end of the protruding portion 110b and an outer peripheral surface of the cylindrical member 21 is smaller than a width T of the groove 101. For this reason, in the ground electrode 100, the outer peripheral surface of the peripheral portion P and the upper end surface 100a of the peripheral portion P are covered by the shield member 110, and a part of an upper portion of the groove 101 is covered by the protruding portion 110b. Therefore, as for the ground electrode 100, only a side surface and a bottom surface of the groove 101 are exposed to the exhaust path 80. Further, a reaction product caused by the plasma moves along an exhaust flow formed from an upper side toward a lower side in the exhaust path 80. Since the ground electrode 100 is covered by the shield member 110 and the upper gap U of the groove 101 is slightly opened, it is difficult for the reaction product generated from a plasma process to be introduced into the groove 101 as an exposed portion of the ground electrode 100. Thus, it is possible to suppress the reaction product from adhering to the ground electrode 100, and the plasma processing apparatus 1 can maintain stable plasma.

Meanwhile, electrons emitted from the electrode plate 51 by applying a negative DC voltage to the upper electrode 42 may freely move within the processing chamber 11 regardless of the exhaust flow. For this reason, the electrons emitted from the electrode plate 51 are not shielded by the shield member 110 and reach the ground electrode 100 through the gap U between the shield member 110 and the cylindrical member 21. Thus, it is possible to allow a DC current to flow within the processing chamber 11. Further, if the width G of the gap U is smaller than a thickness of a plasma sheath where the plasma is present within the cylindrical member 21 and the processing chamber 11, it is difficult for the electrons emitted from the electrode plate 51 to reach the ground electrode 100 through the gap U. For this reason, the width G of the gap U is set to be greater than the thickness of the plasma sheath. Further, since the thickness of the plasma sheath is typically about 0.5 mm, the width G is set to be greater than about 0.5 mm, for example, about 3 mm in the present example embodiment.

Figure 4:
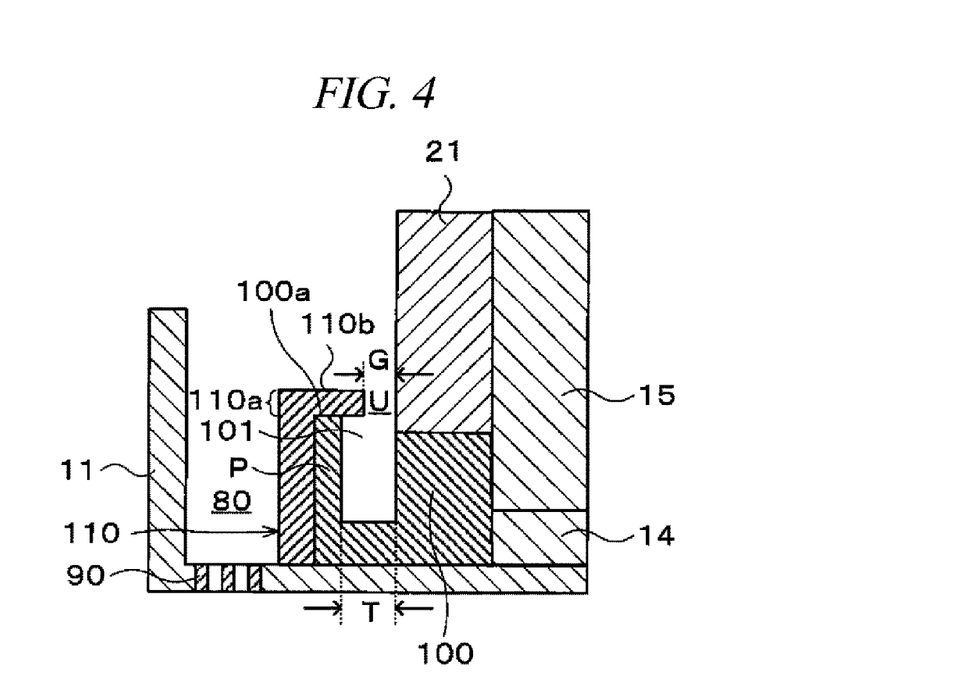
FIG. 4 is a longitudinal cross-sectional view schematically showing a configuration around a ground electrode and a shield member in accordance with another example embodiment.

Further, in FIG. 2, a height of the upper end surface 100a of the ground electrode 100 is equal to that of a portion of the ground electrode 100 in contact with a lower end surface of the cylindrical member 21, but they are not necessarily equal to each other. By way of example, as shown in FIG. 4, a height of the ground electrode 100 at a side of the cylindrical member 21 may be lower than a height of the upper end surface 100a. Even in this case, the ground electrode 100 is covered by the shield member 110, so that it is possible to suppress a reaction product generated from a plasma process from being introduced into and adhering to the groove 101 of the ground electrode 100.

In the plasma processing apparatus 1, the control unit 150 is provided as described above. The control unit 150 is, for example, a computer and includes a program storage unit (not illustrated). The program storage unit is configured to store a program for operating the plasma processing apparatus 1 by controlling each of the power supplies 30, 40, and 61, each of the matching units 31 and 41, and the flow rate control unit 73.

Further, the program is stored in a computer-readable storage medium such as a hard disk (HD), a flexible disk (FD), a compact disk (CD), a magneto-optical disk (MO), a memory card, or the like, and may be installed in the control unit 150 from the storage medium.

The plasma processing apparatus 1 in accordance with the present example embodiment is configured as described above. Hereinafter, a plasma etching process performed in the plasma processing apparatus 1 of the present example embodiment will be explained.

In the plasma etching process, the wafer W is first loaded into the processing chamber 11, and then, mounted and held on the wafer chuck 10. On the wafer W, an etching pattern of a photoresist as an etching mask is previously formed. Then, the inside of the processing chamber 11 is exhausted by the exhaust device 93, and also, a processing gas is supplied into the processing chamber 11 from the processing gas supply source 72 at a certain flow rate.

Thereafter, the first high frequency power supply 30 and the second high frequency power supply 40 continuously apply the high frequency powers to the susceptor 13 serving as the lower electrode, and also, the DC power supply 61 continuously applies the negative DC voltage to the upper electrode 42. Thus, the processing gas supplied into the processing chamber 11 is excited into plasma between the upper electrode 42 and the susceptor 13, and an etching process is performed on the wafer W with ions or radicals generated by the plasma within the processing chamber 11. Further, the photoresist is negatively charged, and in the beginning of the etching process, the electric charges on an etching surface are neutralized. For this reason, if the etching process is performed by applying the high frequency powers only, as an aspect ratio is increased, positive ions are deposited on a bottom portion of an etching hole, so that the etching surface becomes positively charged. For this reason, a path of the positive ions highly contributing to the etching process is curved by repulsion of the electric charges within the etching hole, so that a shape of the etching hole is bent or deformed. Further, it is difficult for the positive ions to reach the bottom portion of the etching hole, and, thus, an etching rate is decreased.

Herein, in the present example embodiment, since a negative DC voltage is applied to the upper electrode 42, more secondary electrons are generated and highly accelerated to be projected into the etching hole. For this reason, more secondary electrons and negative ions can be supplied into the etching hole. As a result, since the electric charges positively charged within the etching hole can be neutralized, when the plasma is generated by the high frequency power supply, the positive ions may not be curved within the etching hole. Accordingly, the etching process can be performed well.

Further, an atmosphere within the processing chamber 11 is exhausted from the exhaust opening 90 at the bottom portion of the processing chamber 11 through the exhaust path 80. Since the ground electrode 100 is covered by the shield member 110, it is possible to suppress a reaction product generated from the plasma from being deposited on the ground electrode 100. Meanwhile, the electrons emitted from the electrode plate 51 freely move within the processing chamber 11 regardless of the exhaust flow. For this reason, the electrons emitted from the electrode plate 51 are not shielded by the shield member 110 and reach the ground electrode 100 through the gap U between the shield member 110 and the cylindrical member 21. As a result, it is possible to allow a DC current to stably flow within the processing chamber 11. Thus, the plasma processing apparatus 1 can maintain stable plasma.

Further, since the groove 101 is formed into a downward recess at the outer peripheral portion of the ground electrode 100, a surface area of the ground electrode 100 exposed within the processing chamber 11 becomes relatively larger as compared with the conventional case where the groove is not formed. For this reason, a function deterioration of the ground electrode 100 when the reaction product adheres to the ground electrode 100 is decreased as compared with the conventional ground electrode in which a groove is not formed. Therefore, in accordance with the above-described example embodiment, even if the reaction product generated from the plasma process adheres to the ground electrode through the gap U between the shield member 110 and the cylindrical member 21, it is possible to stably apply the DC voltage into the processing chamber for a long time as compared with the case using the conventional ground electrode 100.

In the following comparative test carried out by the present inventor, it is confirmed that a thickness of the protruding portion 110b is in a range of desirably from about 2 mm to about 6 mm and the width G of the gap U formed between the front end of the protruding portion 110b and the outer peripheral surface of the cylindrical member 21 is in a range of desirably from about 3 mm to about 5 mm. Further, it is confirmed that the width T of the groove 101 is in a range of desirably from about 3 mm to about 9 mm. Furthermore, it is confirmed that a ratio of the width G of the gap U with respect to the width T of the groove 101 is in a range of desirably from about 1:1 to about 1:3.

Figure 5:
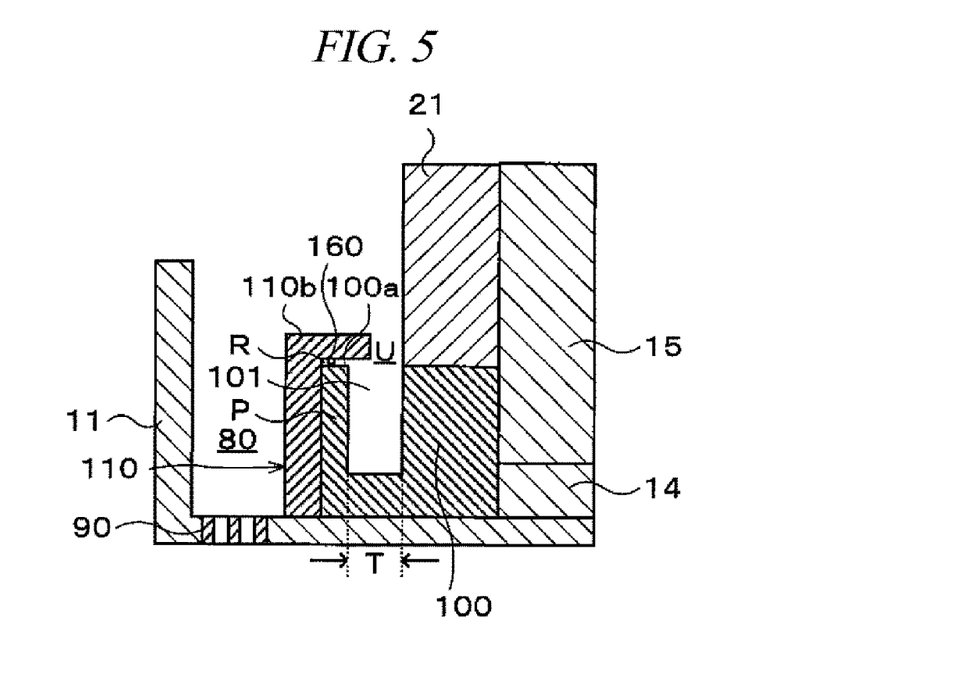
FIG. 5 is a longitudinal cross-sectional view schematically showing a configuration around a ground electrode and a shield member in accordance with still another example embodiment.
Figure 6:
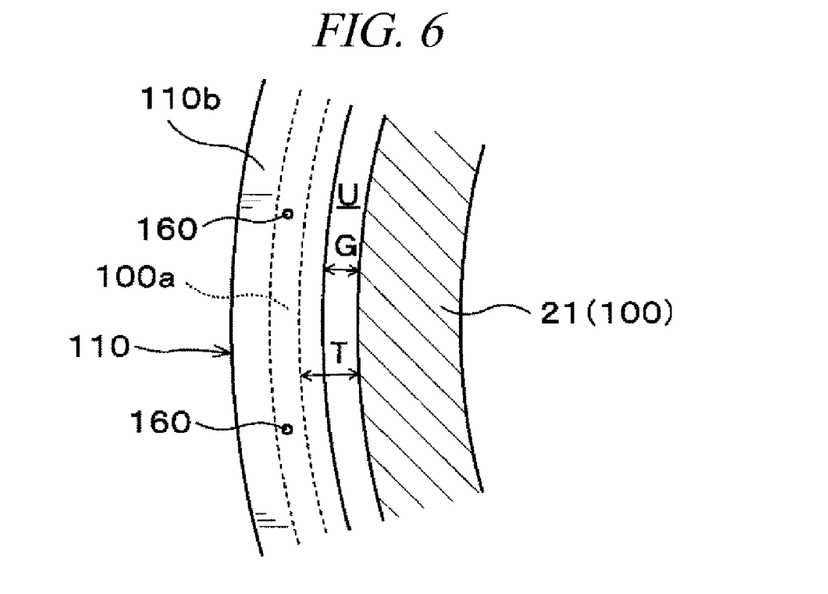
FIG. 6 is a transversal cross-sectional view schematically showing a configuration around the ground electrode and the shield member in accordance with still another example embodiment.

In the above-described example embodiment, the lower surface of the protruding portion 110b of the shield member 110 is in contact with the upper end surface 100a of the ground electrode 100, but the protruding portion 110b and the upper end surface 100a of the ground electrode 100 may not be necessarily in contact with each other. By way of example, as shown in FIG. 5, there may be formed a gap R between the upper end surface 100a and the lower surface of the protruding portion 110b. When the gap R is formed as such, a surface area of the ground electrode 100 to be exposed within the processing chamber 11 may be increased as much as the area of the upper end surface 100a of the ground electrode 100. Thus, with respect to adhesion of a reaction product generated from the plasma process, a larger margin can be obtained. Further, when forming the gap R, a height of the shield member 110 may be increased. Otherwise, for example, as shown in FIG. 5 and FIG. 6, spacers 160 may be provided on a circle with a regular interval between the lower surface of the protruding portion 110b and the upper end surface 100a of the ground electrode, and various manners may be applied without being limited to the present example embodiment.

Figure 7:
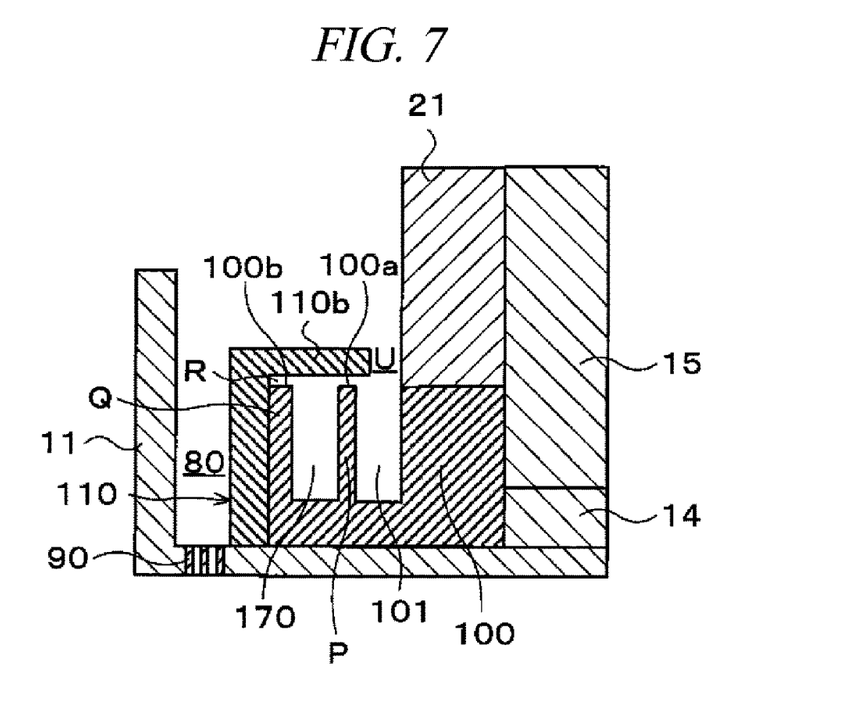
FIG. 7 is a longitudinal cross-sectional view schematically showing a configuration around a ground electrode and a shield member in accordance with still another example embodiment.
Figure 8:
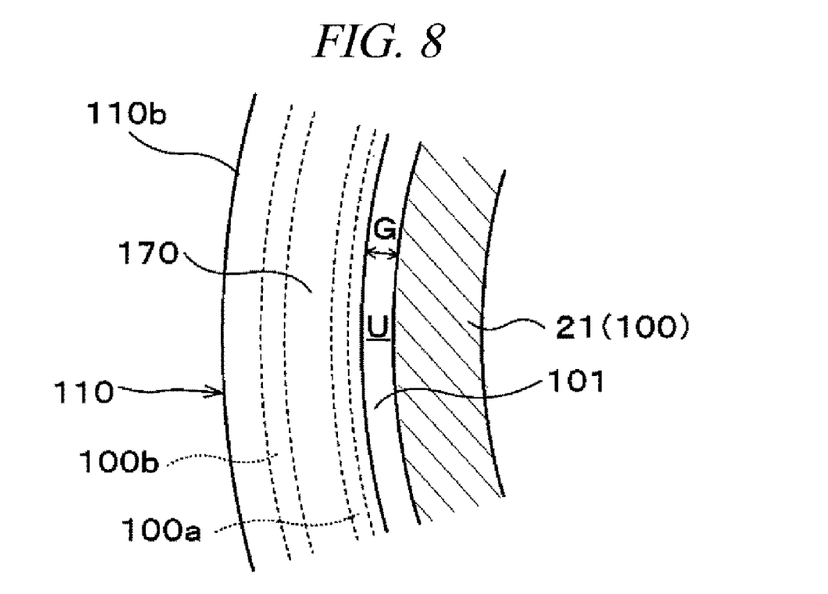
FIG. 8 is a transversal cross-sectional view schematically showing a configuration around the ground electrode and the shield member in accordance with still another example embodiment.
Figure 9:
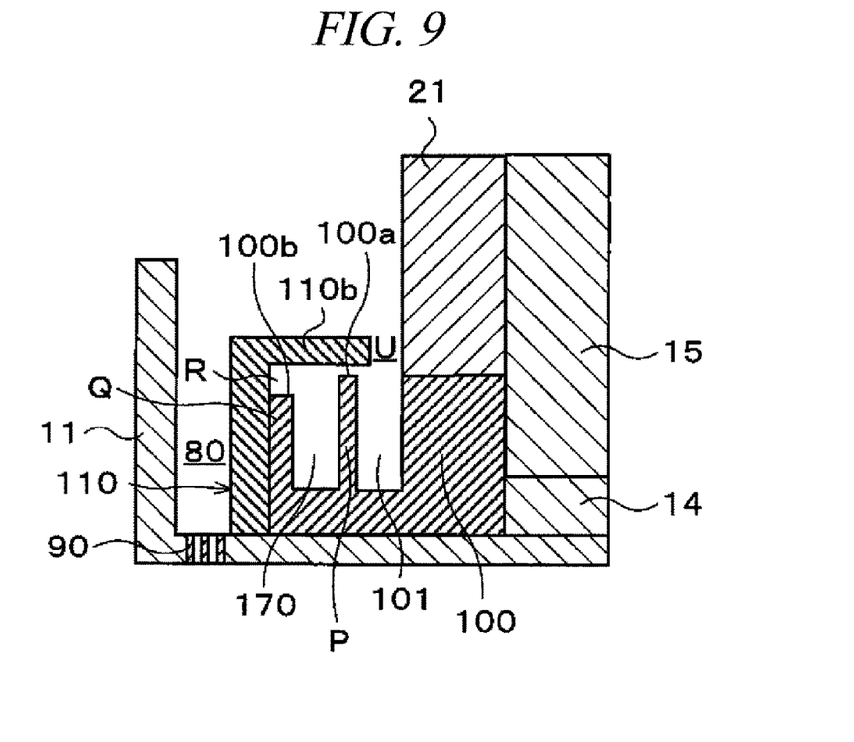
FIG. 9 is a longitudinal cross-sectional view schematically showing a configuration around a ground electrode and a shield member in accordance with still another example embodiment.

Further, in the above-described example embodiment, the groove 101 is formed at the outer peripheral portion of the ground electrode 100, but as shown in FIG. 7 and FIG. 8, another groove 170 including a farther peripheral portion Q (second peripheral portion) may be formed at an outer side of the groove 101, and the gap R may be formed between the upper end surface 100a of the peripheral portion P and the lower surface of the protruding portion 110b. Even in this case, a surface area of the ground electrode 100 to be exposed within the processing chamber 11 is also increased as much as the areas of surfaces of the groove 170, the upper end surface 100a of the peripheral portion P and an upper end surface 100b of the peripheral portion Q. Thus, with respect to adhesion of a reaction product generated from a plasma process, a larger margin can be obtained. In this case, for example, as shown in FIG. 9, by allowing the heights of the peripheral portion P and the peripheral portion Q to be different from each other, the gap R between the lower end surface of the protruding portion 110b and the upper end surface 100a of the peripheral portion P and the gap R between the lower end surface of the protruding portion 110b and the upper end surface 100b of the peripheral portion Q can be different from each other. Further, even if the groove 170 is formed, the protruding portion 110b of the shield member 110 is provided such that the front end thereof can be positioned above the groove 101 in a plane view.

Figure 10:
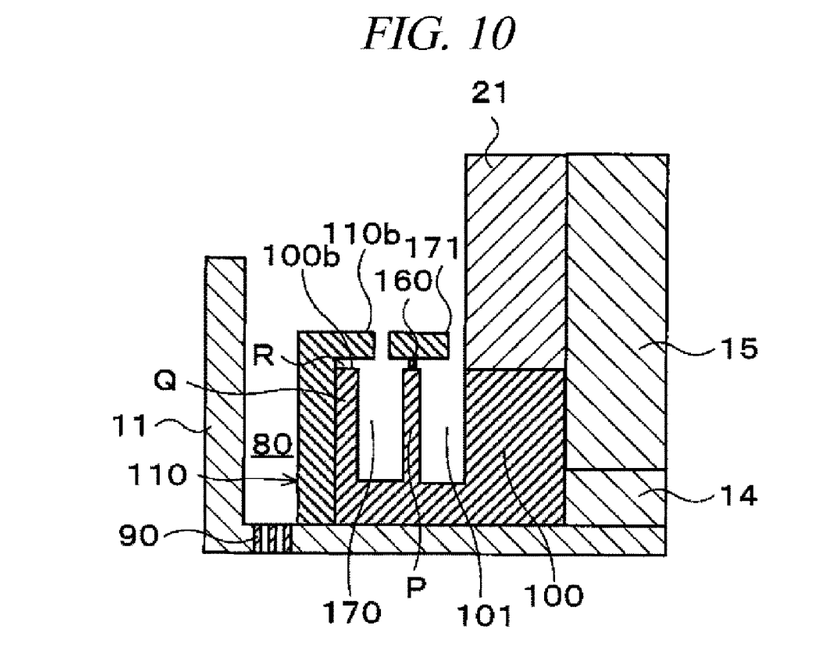
FIG. 10 is a longitudinal cross-sectional view schematically showing a configuration around a ground electrode and a shield member in accordance with still another example embodiment.
Figure 11:
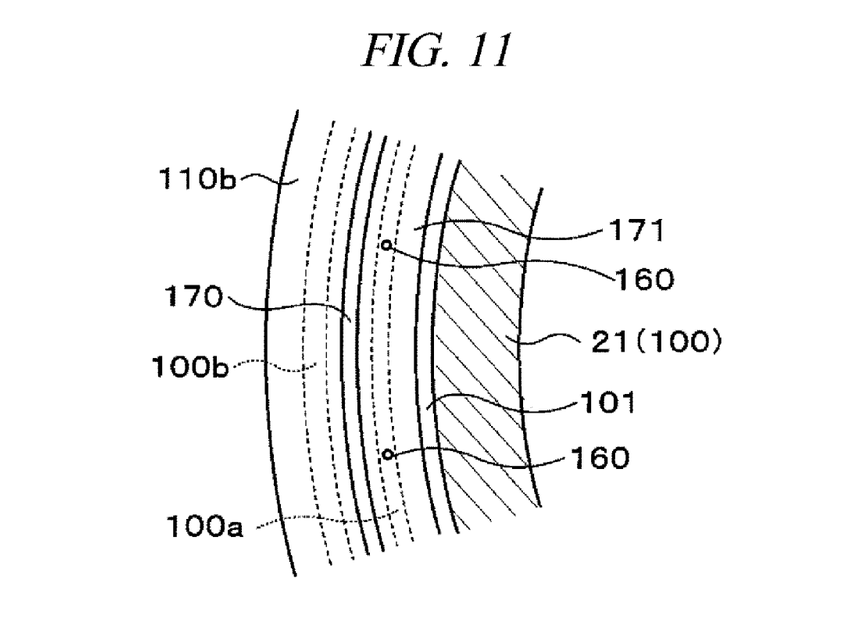
FIG. 11 is a transversal cross-sectional view schematically showing a configuration around the ground electrode and the shield member in accordance with still another example embodiment.

Further, when the groove 170 is formed, a shape of the shield member 110 is not limited to one as shown in FIG. 7. By way of example, as shown in FIG. 10 and FIG. 11, the protruding portion 110b of the shield member 110 may be provided such that the front end thereof may be positioned above the groove 170 and another annular shield member 171 may be further provided between the groove 101 and the groove 170 via the spacers 160. Otherwise, if side surfaces and bottom surfaces of the groove 101 and the groove 170 are exposed within the processing chamber 11, any structure can be applied.

Figure 12:
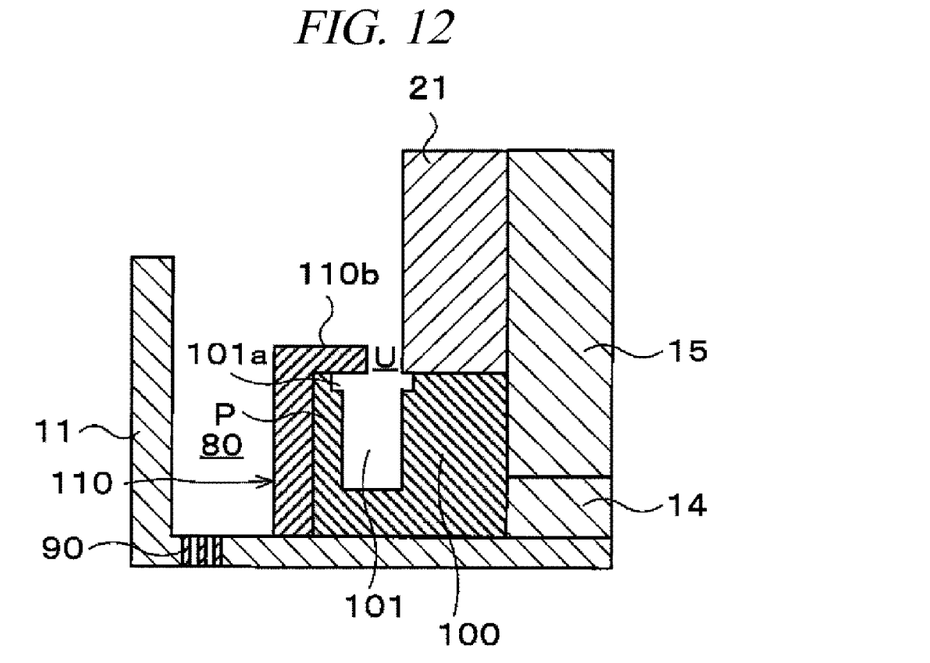
FIG. 12 is a longitudinal cross-sectional view schematically showing a configuration around a ground electrode and a shield member in accordance with still another example embodiment.
Figure 13:
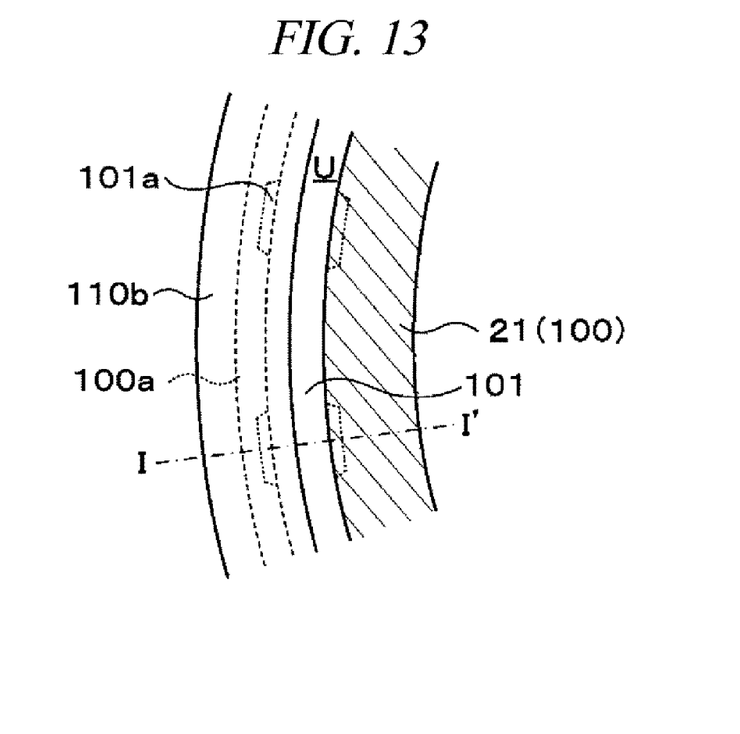
FIG. 13 is a transversal cross-sectional view schematically showing a configuration around the ground electrode and the shield member in accordance with still another example embodiment.

Since the plasma is generated within the groove 101 of the ground electrode 100, the ground electrode 100 may be sputtered to be cut by the plasma. In this case, a shape of the ground electrode 100 may be changed, and the function of the ground electrode 100 may be deteriorated with the lapse of time in the same manner as a case where a reaction product generated from a plasma process adheres to the ground electrode 100. Therefore, for example, as shown in FIG. 12 and FIG. 13, if extended portions 101a are formed by previously cutting portions within the groove 101, which correspond to the regions where the plasma is generated, function deterioration of the ground electrode 100 caused by the sputtering can be suppressed. Further, these extended portions 101a are not necessarily formed along the entire circumference of the groove 101, and may be formed with a certain interval. A cross-sectional view of FIG. 12 is a partial cross-sectional view taken along a line I-I' of FIG. 13.

EXPERIMENTAL EXAMPLE

Figure 14:
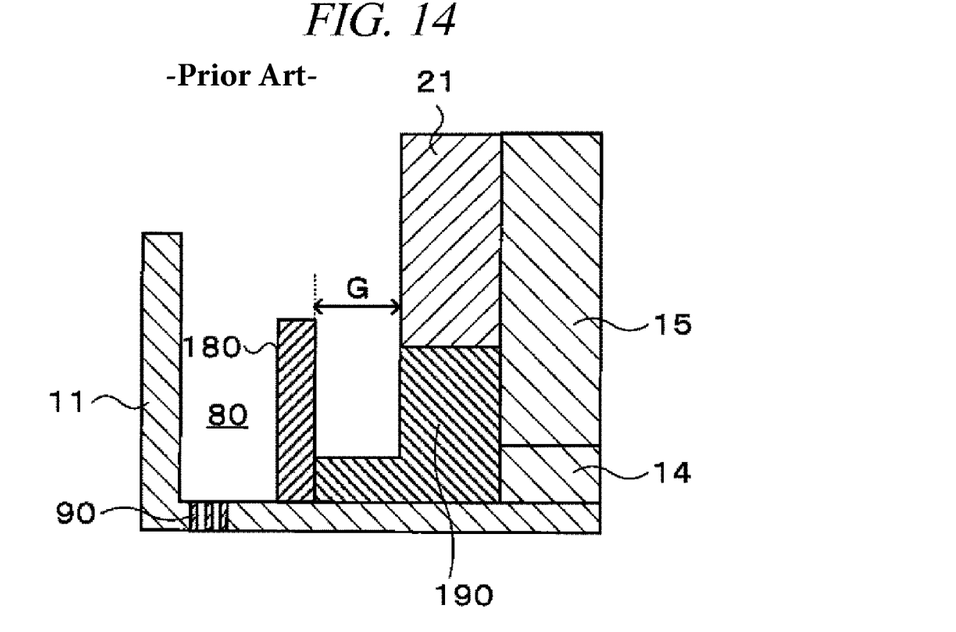
FIG. 14 is a longitudinal cross-sectional view schematically showing a configuration around a ground electrode and a shield member in accordance with a comparative example.

As an experimental example, a plasma process is carried out while changing the width T of the groove 101 of the ground electrode 100 and a length (the width G of the gap U) of the protruding portion 110b of the shield member 110 illustrated in FIG. 2, and then, a test for checking an effect on a function deterioration of the ground electrode 100 with the lapse of time is conducted. In this case, a thickness of the protruding portion 110b in the vertical direction is about 3 mm, and plasma process conditions include a pressure of about 15 mTorr within the processing chamber 11, a power of about 2700 W from the first high frequency power supply 30, a power of about 4500 W from the second high frequency power supply 40, a DC voltage of 150 V, and $C_4F_6/Ar/O_2$ as a processing gas respectively supplied at a flow rate of 30/600/22 sccm. Further, as a comparative example, with respect to a conventional shield member 180 having a linear cross section, i.e., the shield member 180 without the protruding portion 110b as shown in FIG. 14 (comparative example 1) and a shield member 110 including the protruding portion 110b as FIG. 15 (comparative example 2), the test is conducted using a ground electrode 190 in which the groove 101 is not formed.

Figure 15:
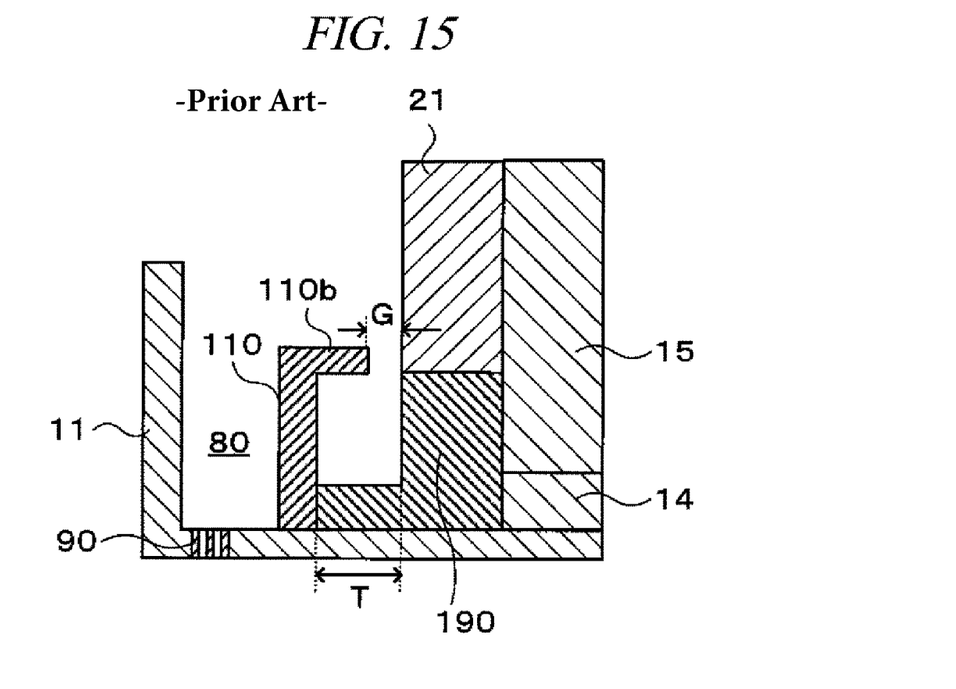
FIG. 15 is a longitudinal cross-sectional view schematically showing a configuration around a ground electrode and a shield member in accordance with another comparative example.

A test result is shown in Table 1. When the plasma is generated within the processing chamber 11, a case where an emission intensity of Ar is maintained at about 1000 or less even after a lapse of about 400 seconds, which means that the function of the ground electrode 100 is maintained, is expressed by "○", a case where an emission intensity thereof is maintained at about 100 or less even after a lapse of about 400 seconds is expressed by "⊙". In Table, "X" shows a case where an emission intensity of Ar exceeds about 1000 before a lapse of about 400 seconds. Although the groove 101 is not formed in the ground electrode 190 of the comparative example 1 and the comparative example 2, as shown in FIG. 14 and FIG. 15, widths between the shield members 110 and 180 and the ground electrode 190 are expressed by a width T in Table 1 for convenience. Further, in the comparative example 1, since the shield member 180 without the protruding portion 110b is used, the gap U is not formed.

However, in Table 1, a value of the width T is described as a value of the width G of the gap U for convenience.

TABLE 1

|  | Width G of gap U [mm] | Width T [mm] | Evaluation |
| --- | --- | --- | --- |
| Comparative Example 1 | 5 | 5 | X |
| Comparative Example 2 | 3 | 9 | X |
| Experimental Example 1 | 3 | 3 | ○ |
| Experimental Example 2 | 5 | 7 | ○ |
| Experimental Example 3 | 3 | 9 | ◎ |

In the comparative example 1 as the conventional case, the ground electrode 100 is not sufficiently shielded by the shield member, and function of the ground electrode 100 is deteriorated after a lapse of about 400 seconds. Further, in the comparative example 2 using the shield member 110 having an inverse L-shape, function deterioration of the ground electrode 100 after a lapse of about 400 seconds can be seen. Although the shield member 110 has a good shielding effect, in the ground electrode in which the groove is not formed, a surface area of an exposed portion thereof within the processing chamber 11 is small. Accordingly, it is considered that there is an effect of a small amount of a reaction product which is generated from a plasma process and passes through the gap between the shield member 110 and the cylindrical member 21.

In this regard, it is confirmed that all of the experimental examples 1 to 3 can suppress the function deterioration of the ground electrode 100 with the lapse of time. Further, in the experimental example 1, the width G of the gap U is equal to the width T of the groove 101, but when the width G of the gap U is set to about 3 mm, the good shielding effect of the shield member 110 can be obtained. Thus, it is assumed that adhesion of the reaction product to the groove 101 can be suppressed. From this result, it is confirmed that the protruding portion 110b of the shield member 110 is not necessarily formed to be positioned above the groove 101, and the width G of the gap U needs to be set to be smaller than a preset value, for example, about 3 mm or less.

Further, in the experimental example 2, the width G of the gap U is set to about 5 mm greater than that of the experimental example 1. Thus, it is assumed that the shielding effect of the shield member 110 is lower than that of the experimental example 1. However, since a surface area to be exposed within the processing chamber 11 is increased by increasing the width T of the groove 101 to about 7 mm, it is assumed that the function deterioration of the ground electrode 100 with the lapse of time is suppressed in the same manner as the experimental example 1.

Furthermore, in the experimental example 3, the width G of the gap U is set to be about 3 mm, and the width T of the groove 101 is set to be about 9 mm. Therefore, it is confirmed that due to an interaction between the surface area of an exposed portion of the ground electrode 100 and the shielding effect of the shield member 110, the emission intensity of argon is maintained at about 100 or less even after a lapse of about 400 seconds, so that the function deterioration of the ground electrode 100 with the lapse of time is effectively suppressed.

From the above-described results, it is confirmed that the width G of the gap U formed between the front end of the protruding portion 110b and the outer peripheral surface of the cylindrical member 21 is in a range of desirably from about 3 mm to about 5 mm, and the width T of the groove 101 is in a range of desirably from about 3 mm to about 9 mm. Further, it is confirmed that the ratio of the width G of the gap U to the width T of the groove 101 is approximately in a range of desirably from about 1:1 to about 1:3.

Although the example embodiment has been explained above, the present disclosure is not limited thereto. It is clear that various changes and modifications may be made by those skilled in the art in the scope of the present disclosure defined by the following claims, and it shall be understood that all modifications and embodiments conceived from the meaning and scope of the claims and their equivalents are included in the scope of the present disclosure.

The claims of the present application are different and possibly, at least in some aspects, broader in scope than the claims pursued in the parent application. To the extent any prior amendments or characterizations of the scope of any claim or cited document made during prosecution of the parent could be construed as a disclaimer of any subject matter supported by the present disclosure, Applicants hereby rescind and retract such disclaimer. Accordingly, the references previously presented in the parent applications may need to be revisited.

EXPLANATION OF REFERENCE NUMERALS

1: Plasma processing apparatus
10: Wafer chuck
11: Processing chamber
12: Grounding line
13: Susceptor
14: Insulating plate
15: Supporting table
20: Correction ring
21: Cylindrical member
22: Heat transfer gas line
30: First high frequency power supply
31: First matching unit
40: Second high frequency power supply
41: Second matching unit
42: Upper electrode
50: Shield member
51: Electrode plate
52: Electrode supporting plate
53: Gas supply opening
54: Gas diffusion room
55: Gas hole
60: Low pass filter
61: DC power supply
71: Gas supply line
72: Processing gas supply source
73: Flow rate control unit
80: Exhaust path
90: Exhaust opening
91: Exhaust chamber
92: Exhaust pipe
93: Exhaust device
100: Ground electrode
101: Groove
110: Shield member
110b: Protruding portion
150: Control unit
160: Spacer
170: Another groove
W: Wafer T: Width
U: Gap
G: Width

I claim:

1. A plasma processing apparatus for exciting a processing gas into plasma by applying a high frequency power between an upper electrode and a lower electrode provided within a processing chamber and performing a plasma process on a target object to be processed with the plasma, the plasma processing apparatus comprising:
    a DC power supply configured to apply a DC voltage to the upper electrode;
    a ground electrode, provided within the processing chamber, configured to serve as a ground with respect to the DC voltage applied to the upper electrode; and
    an annular shield member provided outside the ground electrode,
    wherein a groove is formed into a downward recess with a first peripheral portion at an outer peripheral portion of the ground electrode,
    an upper end of the shield member is positioned above an upper end of the first peripheral portion of the ground electrode, and
    a protruding portion, which is protruded toward a center of the ground electrode, is formed at a portion of the shield member positioned above the ground electrode,
    wherein a region, at which the groove has a width larger than other regions thereof, is formed in the groove,
    in a plane view, a front end of the protruding portion covers the first peripheral portion and is positioned above the groove of the ground electrode, and
    a lower surface of the protruding portion is in contact with an outer region of the groove of the ground electrode.

2. The plasma processing apparatus of claim 1, wherein a ratio of a horizontal distance between a side surface of the groove at a central side of the ground electrode and a front end of the protruding portion with respect to a horizontal width of the groove is from about 1:1 to about 1:3.

3. The plasma processing apparatus of claim 2, wherein the horizontal distance between the side surface of the groove at the central side of the ground electrode and the front end of the protruding portion is in a range from about 3 mm to about 5 mm, and the horizontal width of the groove is in a range from about 3 mm to about 9 mm.

* * * * *